United States Patent
Kaikuranta et al.

(10) Patent No.: US 6,633,241 B2
(45) Date of Patent: Oct. 14, 2003

(54) CAPACITIVELY COUPLED KEYPAD STRUCTURE

(75) Inventors: Terho Kaikuranta, Piispanristi (FI); Seppo Salminen, Turku (FI); Bror Svarfvar, Kaarina (FI); Petri Vuori, Salo (FI)

(73) Assignee: Nokia Mobile Phones Ltd., Espoo (FI)

( * ) Notice: Subject to any disclaimer, the term of this patent is extended or adjusted under 35 U.S.C. 154(b) by 356 days.

(21) Appl. No.: 09/746,464

(22) Filed: Dec. 21, 2000

(65) Prior Publication Data

US 2002/0093489 A1 Jul. 18, 2002

(30) Foreign Application Priority Data

Dec. 28, 1999 (FI) ............................... 19992794

(51) Int. Cl.[7] ............................................. H03M 11/00
(52) U.S. Cl. ............................ 341/33; 341/20; 341/22; 345/168; 345/172; 379/369; 379/433.07; 379/370; 361/680
(58) Field of Search ................................ 341/20, 22, 23; 379/433.06, 433.07, 368, 369, 370; 345/168, 172; 361/680; 455/90.3

(56) References Cited

U.S. PATENT DOCUMENTS

| | | | | |
|---|---|---|---|---|
| 3,971,925 A | * | 7/1976 | Wenninger et al. | 708/130 |
| 3,974,332 A | | 8/1976 | Abe et al. | 178/18 |
| 4,047,241 A | | 9/1977 | Lau et al. | 361/288 |
| 4,743,464 A | | 5/1988 | Larguier et al. | 427/58 |
| 5,144,302 A | * | 9/1992 | Carter et al. | 341/20 |
| 5,146,615 A | * | 9/1992 | Hodsdon et al. | 455/90 |
| 5,576,981 A | * | 11/1996 | Parker et al. | 708/140 |
| 5,745,566 A | * | 4/1998 | Petrella et al. | 379/433.13 |
| 5,832,371 A | * | 11/1998 | Thornton | 455/90 |
| 5,848,152 A | * | 12/1998 | Slipy et al. | 379/433.13 |
| 5,982,881 A | * | 11/1999 | Mischenko | 379/433.11 |
| 5,983,116 A | | 11/1999 | Nash et al. | 455/550 |
| 6,009,164 A | * | 12/1999 | Yun | 379/368 |
| 6,115,616 A | * | 9/2000 | Halperin et al. | 455/557 |
| 6,172,620 B1 | * | 1/2001 | Brick et al. | 341/22 |
| 6,222,466 B1 | * | 4/2001 | Uggmark | 341/22 |
| 6,463,263 B1 | * | 10/2002 | Feilner et al. | 455/90 |

FOREIGN PATENT DOCUMENTS

| | | | |
|---|---|---|---|
| EP | 0 695 041 A2 | | 1/1996 |
| EP | 0952598 A3 | * | 10/1999 |
| EP | 1006545 A1 | * | 6/2000 |
| EP | 1017075 A2 | * | 7/2000 |
| EP | 1028445 A2 | * | 8/2000 |
| WO | WO 98/28763 | * | 7/1998 |

* cited by examiner

*Primary Examiner*—Michael Horabik
*Assistant Examiner*—Albert K. Wong
(74) *Attorney, Agent, or Firm*—Perman & Green, LLP (57) ABSTRACT

A keypad arrangement for an electronic device comprises a keypad comprising activatable keys. It comprises also input signal means (801, 802, 901, 1001, 1601) for bringing an electric input signal to the keypad, and signal conversion means (703, 705, 807, 808, 809, 810, 811, 812, 813, 818, 1208, 1206) for responding to a key activation by selectively converting the input signal into an electric output signal the value of which depends on the activated key. Additionally there are output signal detection means (902, 903, 904, 1002, 1602) for detecting the value of the electric output signal. The arrangement comprises a first electromagnetic coupling (706, 708, 709, 710, 803) between the input signal means and the signal conversion means, and a second electromagnetic coupling (707, 711, 804) between the signal conversion means and the output signal detection means.

16 Claims, 9 Drawing Sheets

Fig. 18

CAPACITIVELY COUPLED KEYPAD STRUCTURE

TECHNOLOGICAL FIELD

The invention concerns generally the electromechanical structures of keyboards. Especially the invention concerns the integration and coupling of keyboard structures into the other electrical and mechanical parts of an electronic device.

BACKGROUND OF THE INVENTION

Figure 1:
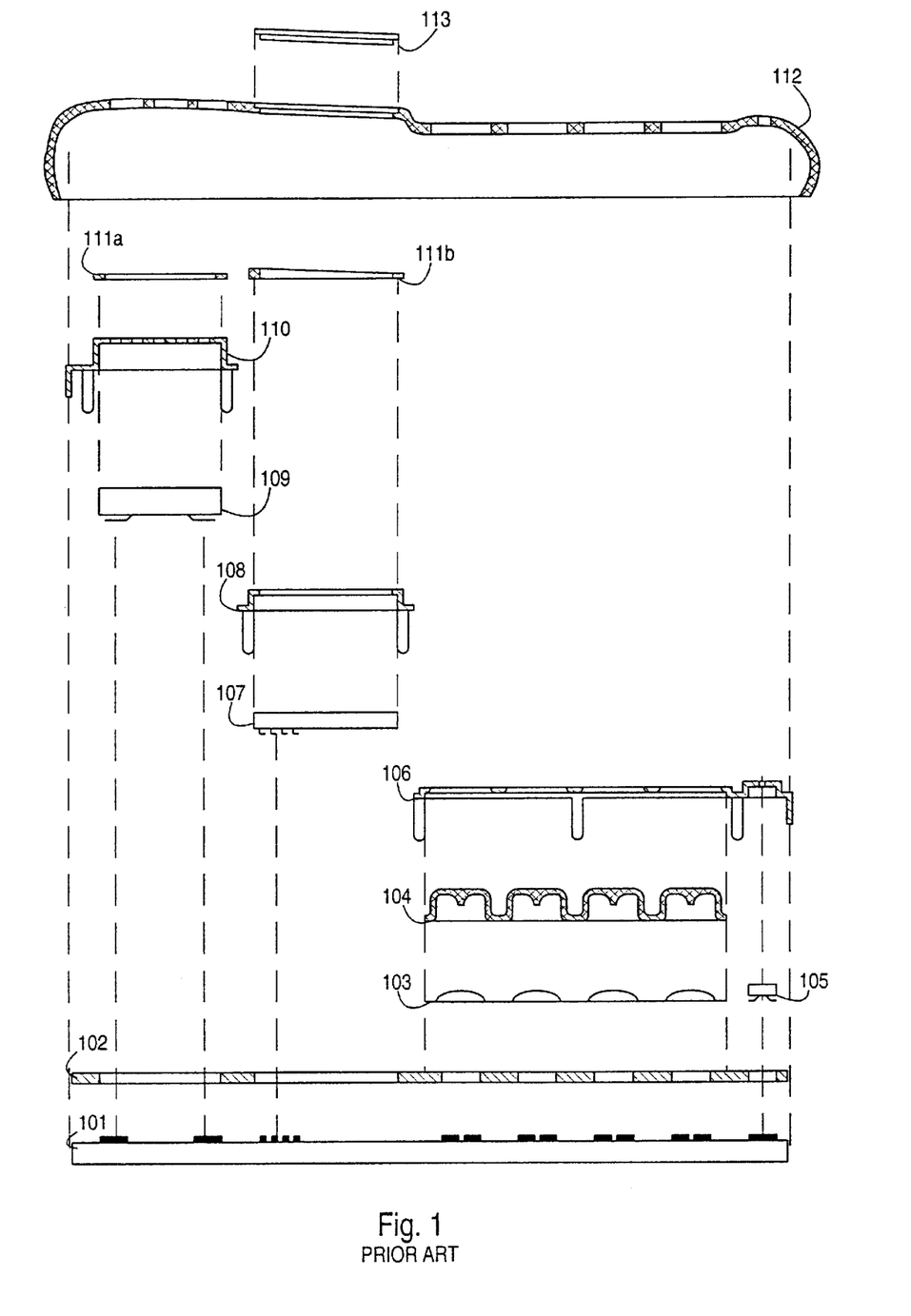
FIG. 1 illustrates a known mechanical structure used in mobile telephones.

A keypad consisting of individually pressable numeric or alphanumeric keys as well as function and control keys is an important part of many modern electronic devices. Especially keyboards of this kind appear in portable telecommunication devices such as mobile telephones and multifunction communicators, portable digital assistants and palmtop computers. FIG. 1 is an exploded cross-sectional view that shows a known structural arrangement which is built on a printed circuit board or PCB 101 with a number of contact pads on its upper surface. An insulating film 102 covers the PCB except of those contact pads onto which components are to be placed. The keyboard part comprises a dome sheet 103 (or alternatively a selection of individual key domes) made of some resilient material that is electrically conductive at least at the concave surface of each dome. Additionally the keyboard part comprises a rubbery keymat 104 where the bulging protrusions coincide with the conductive domes of the dome sheet 103 and constitute the visible parts of the keys. A microphone 105 is coupled to its contact pad(s), and the keyboard-microphone entity is covered by an ESD shield 106 which is made of a thin sheet of stainless steel or other conductive material.

Figure 2:
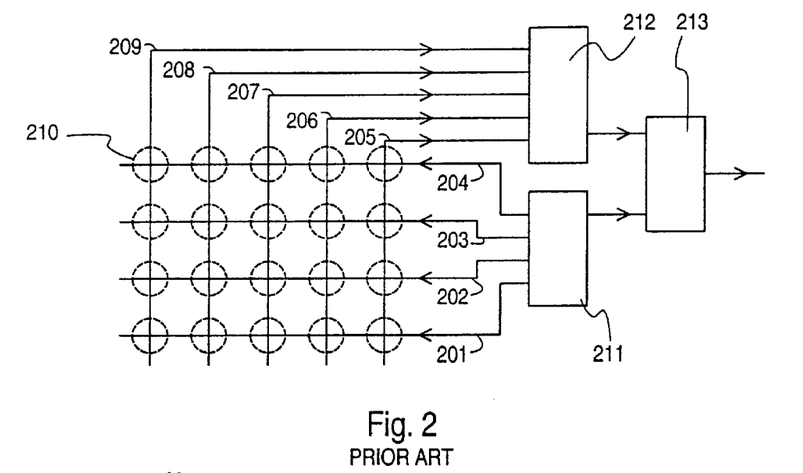
FIG. 2 illustrates a known electrical arrangement for implementing a keypad.

The electric implementations of keypads come in various forms. FIG. 2 illustrates a known rectangular keypad that consists of N×M keys; here N=4 and M=5. The arrangement comprises N conductive input rows 201 to 204 and M conductive output columns 205 to 209 where normally the rows and columns do not have a galvanic contact with each other. At each junction of a row and a column there is a key comprising a conductive dome shown as a dotted circle. Pressing for example the key shown as 210 will cause the conductive dome to produce a galvanic contact between row 204 and column 209. An input voltage distributor 211 energises each of the input rows in cyclical turns at a rate that is expected to exceed the rate of pressing the keys by the user. An output detector 212 detects the energisation caused in one of the output lines when the energisation of the corresponding input line coincides with a conductive dome coupling the input and output lines at one intersection. The logical encoding block 213 converts the observation of a keystroke to a bit sequence that unequivocally indicates, which key was pressed.

The drawbacks of the arrangement of FIG. 2 comprise the relatively high power dissipation of the N parallel voltage buffers included in block 211 that are required to maintain the continuous sequential energisation of the input rows.

Figure 3:
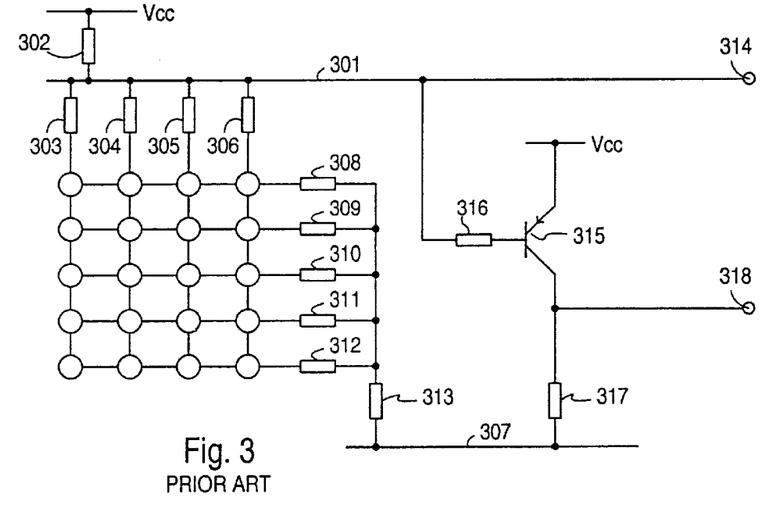
FIG. 3 illustrates another known electrical arrangement for implementing a keypad.

From the European patent publication number EP 695 041, which is incorporated herein by reference, there is known a keypad arrangement according to FIG. 3. A supply voltage Vcc is provided to a positive voltage rail 301 through a resistor 302. From the positive voltage rail there is a connection to each column of keys through a resistor 303–306 so that each of the resistors has a different value. Each row of keys is coupled to a ground rail 307 so that from each row there is a connection to a common connection point through a differently valued resistor 308–312, and from the common connection point there is a connection to the ground rail through a resistor 313. The positive voltage rail 301 is coupled to a first output port 314. The circuit comprises also a PNP transistor 315 the emitter of which is coupled to the supply voltage Vcc, the base of which is coupled to the positive voltage rail 301 through a resistor 316 and the collector of which is coupled to the ground rail 307 through a resistor 317. The collector of the PNP transistor 314 is also coupled to a second output port 318.

The idea of the keypad according to FIG. 3 is that when a certain key is pressed, a resistive current path is produced between the positive voltage rail and the ground rail. The resistance value of the current path is unambiguously associated to the depressed key, because all the column resistors 303–306 and row resistors 308–312 have different values. The variable resistance of the current path acts as a part of a voltage divider together with the resistor 302, which in turn causes the positive voltage rail to assume a voltage value that is also unambiguously associated to the key which was pressed. An A/D converter (not shown) connected to the first output port converts the voltage value of the positive voltage rail into a digital word representing the depressed key. The circuit built around the PNP transistor will generate an interrupt signal that is readable from the second output port and indicates when a key is pressed.

Figure 4:
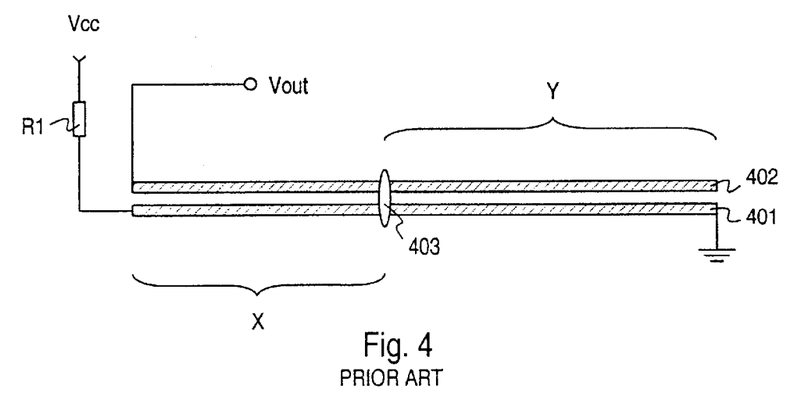
FIG. 4 illustrates another known electrical arrangement for implementing a keypad.

From the European patent application number 99660183.7, which is incorporated herein by reference, there is known a keypad arrangement the functional principle of which is illustrated in FIG. 4. The arrangement comprises a first resistive strip 401 and a second resistive strip 402 in a parallel, non-touching set-up. At point 403 there is a temporary conductive connection between the resistive strips, caused by for example a conductive dome being pressed simultaneously against the surfaces of both resistive strips. The first end (the left-hand end in FIG. 4) of the first resistive strip 401 is coupled to a supply voltage Vcc through a resistor R1 and the second end of the resistive strip 401 is coupled to the ground potential. Correspondingly the first end of the second resistive strip 402 is coupled to an output port for an output voltage Vout to be measurable and the second end of the second resistive strip 402 is not coupled to anywhere.

When one knows the specific resistances of the resistive strips 401 and 402 and the distances X and Y, it is possible to calculate the resistance values of the pieces of resistive strips on each sides of the connection point. By assuming that the output port where the output voltage Vout is measured sinks only a negligible current, it is possible to further calculate the output voltage Vout which turns out to depend only on the position of the conductive connection 403 in relation to the ends of the first resistive strip, as well as on the specific resistance of the strip. Detection of individual key presses boils down to the task of measuring an analogue voltage value. The application EP 99660183.7 suggests various meandering and other shapes to the resistive strips on the surface of a printed circuit board or the like.

As long as the electrical implementations of FIGS. 2, 3 and 4 are based on the mechanical structure shown in FIG. 1, they all share the disadvantage of requiring a relatively large area from the printed circuit board. Additionally they tend to impose limitations to the layout design of the printed circuit board even though the principle shown in FIG. 4 allows for considerably more flexible implementations in this respect than the other solutions.

SUMMARY OF THE INVENTION

It is an object of the invention to provide a keypad structure which is advantageous in terms of manufacturing and places only few limitations to the layout design of both the printed circuit board and the appearance of the keypad itself. It is also an object of the invention to provide a keypad structure that allows reliable and accurate detection of key presses and is tolerable to statistical variation in component characteristics and changes in environmental conditions.

The objects of the invention are achieved by building the keypad as a part of a cover part and by using a suitable coupling to realize the electrical connections between the keypad and other electronic parts of the device in question.

The keypad arrangement according to the invention comprises
- a keypad comprising activatable keys,
- input signal means for bringing an electric input signal to the keypad,
- signal conversion means for responding to a key activation by selectively converting the input signal into an electric output signal the value of which depends on the activated key and
- output signal detection means for detecting the value of the electric output signal;

it is characterized in that it comprises a first electromagnetic coupling between the input signal means and the signal conversion means, and a second electromagnetic coupling between the signal conversion means and the output signal detection means.

The invention applies also to an exchangeable cover for a mobile telecommunication device, comprising a keypad that comprises activatable keys; it is characterized in that the exchangeable cover comprises
- first electromagnetic coupling means for electromagnetically obtaining an electric input signal to the keypad from an external input signal source,
- second electromagnetic coupling means for electromagnetically providing an output signal from the keypad to an external signal detector and
- signal conversion means for responding to a key activation by selectively converting an electric input signal into an electric output signal the value of which depends on the activated key.

Additionally the invention applies to a set of exchangeable covers for a mobile telecommunication device, comprising
- a first cover and a second cover
- within each of said first and second covers means for mechanically attaching the cover to the same mobile telecommunication device,
- within each of said first and second covers a keypad that comprises activatable keys;

it is characterized in that
- the first cover and the second cover each comprise first electromagnetic coupling means for electromagnetically obtaining an electric input signal to the keypad from an external input signal source,
- the first cover and the second cover each comprise second electromagnetic coupling means for electromagnetically providing an output signal from the keypad to an external signal detector,
- the first cover and the second cover each comprise signal conversion means for responding to a key activation by selectively converting an electric input signal into an electric output signal the value of which depends on the activated key and
- the first cover has the keys of the keypad at different locations than the second cover.

Additionally the invention applies to an electronic device comprising
- a keypad that comprises activatable keys,
- an outer cover part,
- a printed circuit board,
- input signal generating means for generating an input signal to the keypad,
- signal conversion means for responding to a key activation by selectively converting the input signal into an output signal the value of which depends on the activated key and
- output signal detection means for detecting the value of the output signal;

it is characterized in that
- the input signal generating means and the output signal detection means are located within the printed circuit board,
- the signal conversion means are attached to the outer cover part and
- the electronic device comprises a first electromagnetic coupling between the input signal generating means and the signal conversion means, and a second electromagnetic coupling between the signal conversion means and the output signal detection means.

According to the invention a majority of the electromechanical parts of the invention are structurally associated with a cover part and not with an "engine PCB" which is a common designator of such printed circuit boards that comprise a remarkable number of electronic components that implement the main functionalities of an electronic device. A capacitive coupling is regarded as the most advantageous form of electrically coupling the keypad to the other electronic parts of the device. The basic form of such a capacitive coupling is a pair of conductive electrodes of which a first electrode is connected to the electric parts of the keypad and a second electrode is connected to the circuitry on an engine PCB. Attaching the cover part and the PCB together brings the electrodes very close to each other so that together they constitute a coupling capacitor.

As a consequence of the invention numerous advantages are achieved. The threedimensional design of the keypad is freed from the planarity of printed circuit boards. The location, number and size of keys becomes completely independent of the PCB layout. Large areas of PCB surface space are left free for other use. Realization of watertight or even hermetically sealed keypad-controlled devices becomes easier. Key press indications can be transmitted through movable joints between device parts. A great degree of freedom is given to the design of exchangeable outer covers.

BRIEF DESCRIPTION OF DRAWINGS

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

FIGS. 1 to 4 have been discussed in the description of prior art, so the following description of the invention and its advantageous embodiments focuses on FIGS. 5a to 18. Same reference designators denote similar parts in the drawings.

DETAILED DESCRIPTION OF THE INVENTION

Figure 5A:
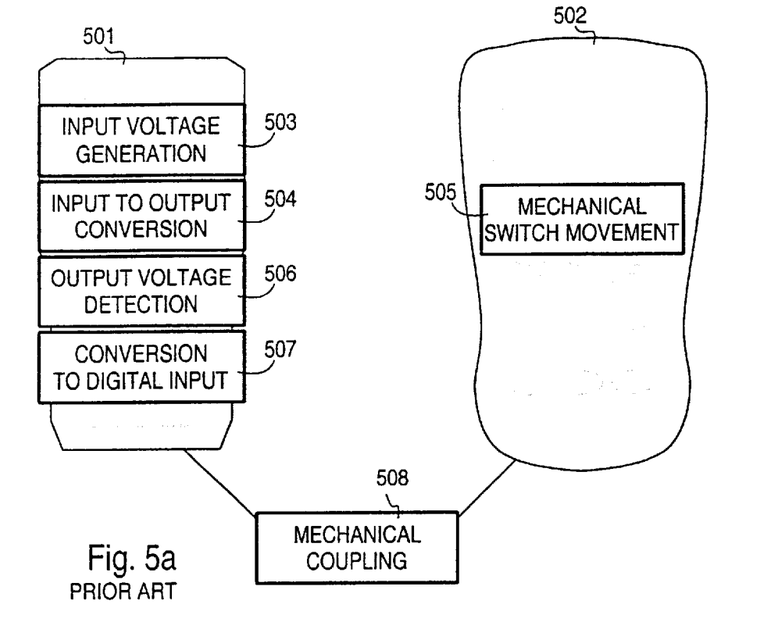
FIG. 5a illustrates a known principal approach in a certain electromechanical structure.

FIG. 5a shows a known principal approach where a keypad-controlled electronic device comprises an engine PCB 501 and an outer cover 502. Among the electrical functions of the PCB are the generation of an input voltage 503 to the keypad, the conversion 504 of the input voltage to an output voltage as a response to a key press, the detection 506 of the output voltage and the conversion 507 of the detected output voltage to a piece of digital input information. Only the outmost mechanical parts 505 (typically a matrix of bulging protrusions) which are touchable and visible to the user are structurally associated with the outer cover 502. Consequently there is only a mechanic coupling 508 between the PCB 501 and the outer cover 502. It is also possible that even the visible bulging parts of the keys are structurally associated with the PCB so that only thing that reminds of the keypad in the outer cover is a hole or a number of holes through which the key tops are accessible.

Figure 5B:
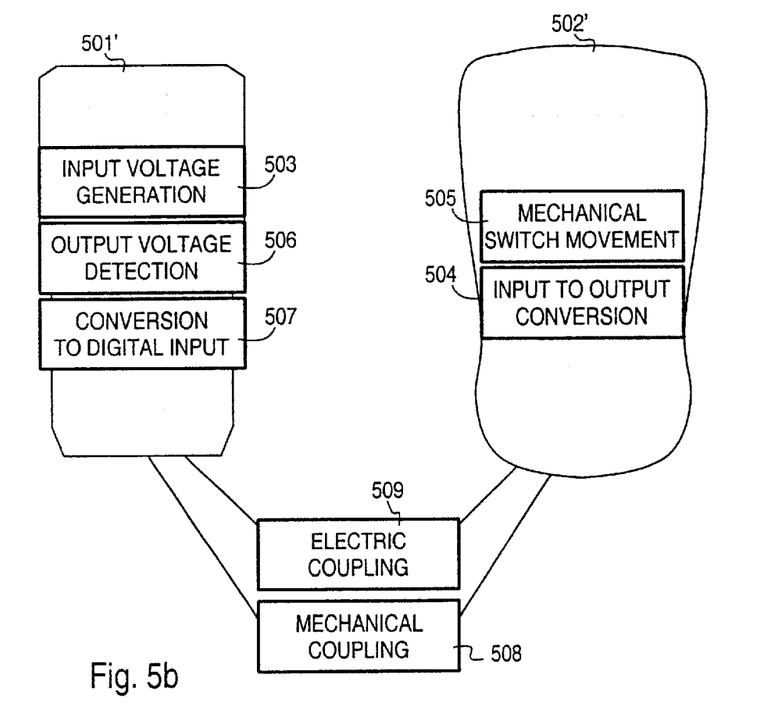
FIG. 5b illustrates a principal approach according to an embodiment of the invention.

FIG. 5b shows a corresponding principal approach which reflects an aspect of the present invention. There is a PCB 501' and an outer cover part 502', but the functions described above are distributed therebetween in a slightly different manner. The PCB 501' is still responsible for generating 503 the input voltage to the keypad and detecting 506 the output voltage as well as converting 507 the latter into a piece of digital information. However, in addition to the mechanical switching action 505 also the conversion 504 of the input voltage into an output voltage as a response to a key press is now structurally associated with the cover part 502'. The interaction between the functionalities 503, 504 and 506 necessitates also some kind of electrical coupling 509 between the PCB 501' and the outer cover 502'.

The principal approaches of FIGS. 5a and 5b are based on the use of voltage signals in association with the keypad. However, it is clear to the person skilled in the art that other electrical signal forms such as current signals can also be used.

The implementation of the electrical coupling 509 is a crucial factor to the applicability and reliability of the principal approach shown in FIG. 5b. The most straightforward way of implementing an electrical connection between two structurally different entities is to use a pair of mutually engaging electromechanical connectors that lock into each other when the entities in question are attached to each other. However, such an approach based on galvanic connectors requires that the connecting surfaces are kept clean and properly aligned to each other. For example in mobile telephones the possibility of letting the users themselves change the outer covers according to wish has gained popularity. Since the phone manufacturer will eventually get the blame if the electrical coupling 509 fails, even if the actual cause of the failure was in the improper actions of a user, it is most advantageous if the electrical coupling 509 can be made as foolproof as possible.

Figure 6:
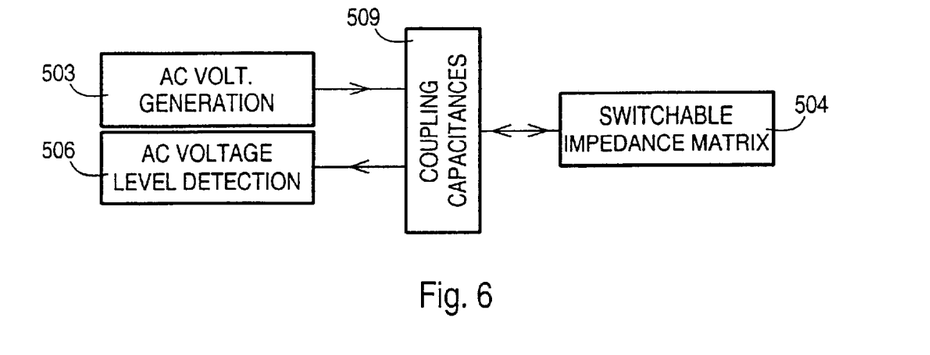
FIG. 6 shows the application of capacitive coupling to the approach of FIG. 5b.

FIG. 6 illustrates the application of capacitive, non-galvanic coupling to solve the above-mentioned problems. Capacitive couplings are best suited for conveying AC signals, so the input voltage generation 503 to the keypad involves here the generation of an AC voltage. The conversion of the input voltage to an AC output voltage takes place in a switchable matrix of impedance paths 504 where pressing each key in the keypad produces a signal path with a certain unambiguously determined impedance value. When the input AC voltage goes through a signal path of a certain impedance, a voltage drop takes place that converts the input voltage to a certain output voltage the level of which reveals the impedance experienced. The output voltage is transferred back over the capacitive interface 509 to a detection block 506 where the level of the AC output voltage level is detected. Also digital signals or digital pulse streams are here considered as AC signals according to the generally known Fourier theory.

A capacitive coupling is very easy to implement. Per connection it only requires two electrodes which are close to each other but insulated from each other in the assembled configuration of the electronic device. The first electrode of each capacitive pair is most advantageously a conductive pad on the surface of the PCB, and the second electrode of each capacitive pair is most advantageously a conductive area at a certain part of the structural entity built around the outer cover part.

Figure 7:
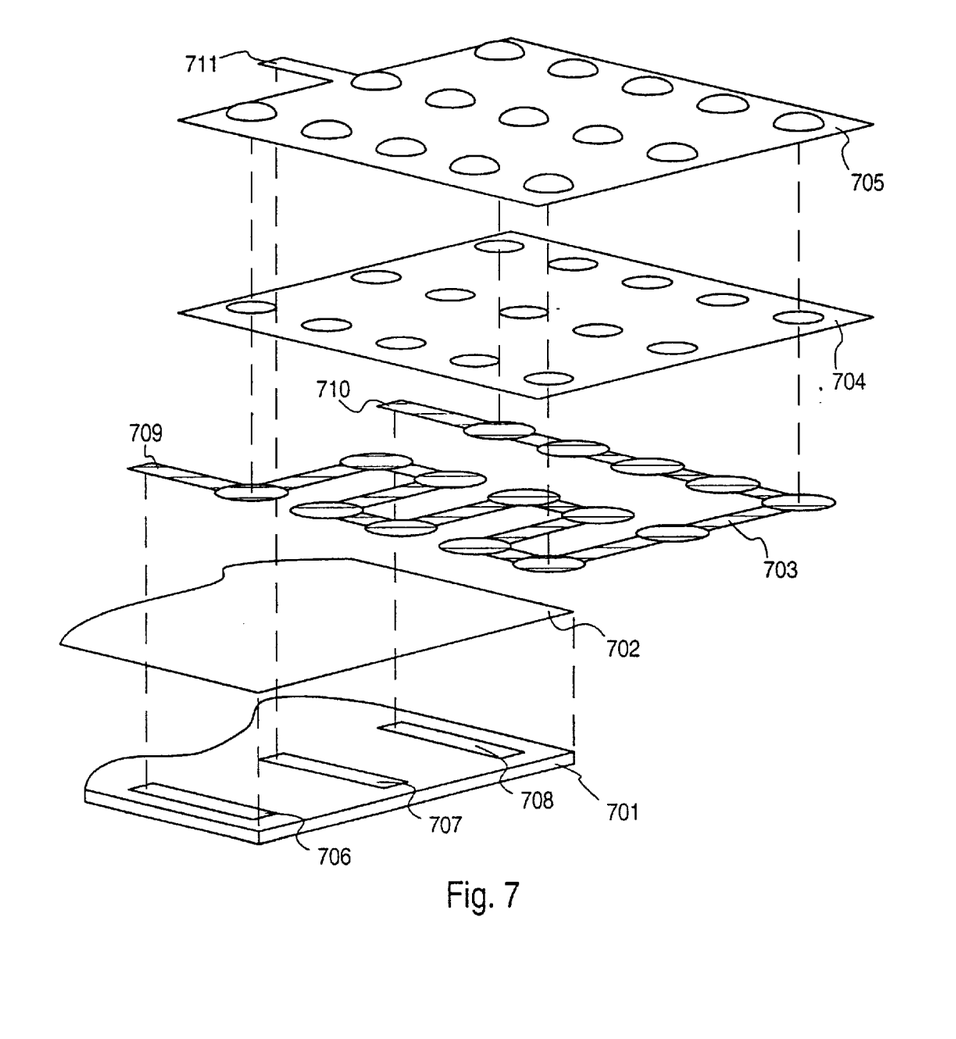
FIG. 7 illustrates a structure according to an embodiment of the invention.

Next we will describe an embodiment of the invention where the keypad functionality is based on the resistive strip approach referred to in the description of prior art. FIG. 7 is an axonometric exploded view showing a PCB 701, a first insulating film 702, a meandering resistive strip 703, a perforated second insulating film 704 and a conductive dome sheet 705. The upper surface of the PCB 701 comprises three conductive pads 706, 707 and 708. The ends of the meandering resistive strip 703 are elongated so that the first end 709 corresponds in size, shape and location to a first conductive pad 706 and the second end 710 corresponds in size, shape and location to a second conductive pad 708. The dome sheet 705 comprises at one edge a conductive tab 711 which corresponds in size, shape and location to a third conductive pad 707. The dashed lines show that in an assembled construction the parts are stacked on top of each other. The term "resistive" means that the strip 703 is made of a material the resistivity of which is large enough to produce a measurable resistance difference between strip pieces the lengths of which differ by the distance between two adjacent keys. The term "conductive" means that the dome sheet conducts electricity so well that the resistance measured between the tab 711 and the key dome closest to it is essentially the same as the resistance measured between the tab 711 and the key dome farthest from it. Isolation or insulation is taken to mean such extremely low conductivity where no practically measurable electric current flows.

The first insulating film 702 covers the conductive pads 706, 707 and 708 so that even in an assembled construction the elongated ends 709 and 710 of the resistive strip 703 and the conductive tab 711 of the conductive dome remain insulated from the conductive pads 706, 707 and 708. The perforated second insulating film 704 insulates the resistive strip 703 from the conductive dome sheet 705 in general, but by pressing a key dome it is possible to produce a touch contact through a hole in the second insulating film between the key dome in question and the part of the resistive at the same location. At some layer of the PCB 701 there is a so-called ground plane (not shown in FIG. 7), which is an essentially continuous conductive layer the potential of which defines the local ground potential.

Figure 8:
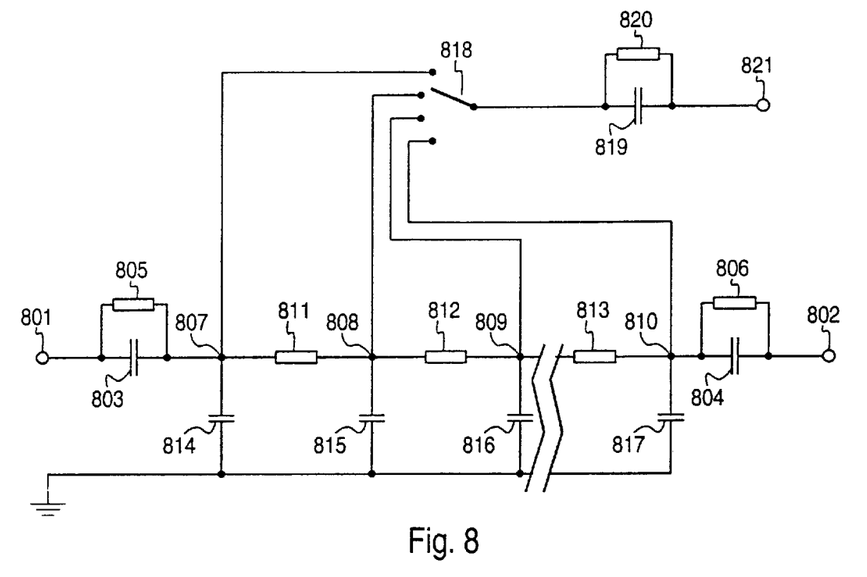
FIG. 8 is an equivalent circuit diagram of FIG. 7, FIGS. 9a, 9b and 9c illustrate various circuits that can be used in association of that of FIG. 8.

FIG. 8 is a circuit diagram that illustrates the electrical aspects of the arrangement of FIG. 7. There are two input ports 801 and 802 which are coupled to first electrodes in input capacitors 803 and 804 respectively. In parallel which each input capacitor 803 and 804 there are resistors 805 and 806 respectively. Between the second electrodes of the input capacitors 803 and 804 there is a series connection of resistors where a coupling point is designated between the resistors. For the sake of simplicity the series connection of resistors is shown only partly, so that coupling points 807, 808, 809 and 810 as well as series resistors 811, 812 and 813 are shown. Between each coupling point and the second input port 802 there are capacitances, of which capacitances 814, 815, 816 and 817 are shown.

The coupling points 807, 808, 809 and 810 are schematically connected to the selectable terminals of a selection switch 818 the common terminal of which is further connected through the parallel connection of an output capacitor 819 and a resistor 820 to an output port 821. The structure of the selection switch 818 is such that it can couple any one or even none of the selectable terminals to the common terminals.

The correspondence between FIGS. 7 and 8 is such that
the input capacitors 803 and 804 correspond to the electrode pairs constituted by one of the conductive pads 706 and 708 and one of the elongated ends 709 and 710 of the resistive strip 703,
the output capacitor 819 corresponds to the electrode pair constituted by the conductive pad 707 and the tab 711,
the parallel input and output resistors 805, 806 and 820 have extremely large ohmic values and correspond to the stray conductivity through the first insulating film 702,
the coupling points 807, 808, 809 and 810 and series resistors 811, 812 and 813 together constitute the resistive strip 703,
the capacitances 814, 815, 816 and 817 represent the stray capacitances between the resistive strip 703 and the ground potential on the PCB 701,
the selection switch 818 corresponds to the dome sheet 705 and
a connection between a selectable terminal and the common terminal in the selection switch 818 corresponds to a key press.

Figure 9A:
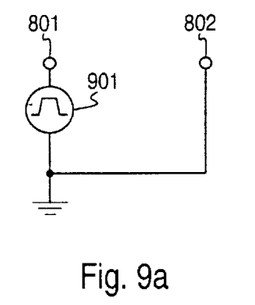
Figure 9B:
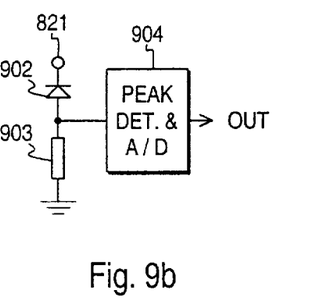
Figure 9C:
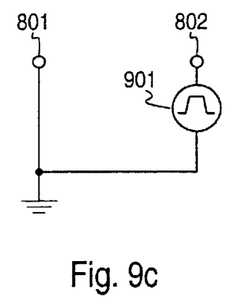

FIGS. 9a, 9b and 9c show some exemplary circuits that may be built on the PCB 701 to use the keypad arrangement described above in association with FIGS. 7 and 8. FIG. 9a shows a voltage generator 901 which is coupled between the first input signal port 801 and a ground potential. The second input signal port 802 is connected to the ground potential. The voltage generator 901 is capable of generating an AC voltage to the resistive strip through the input signal ports 801 and 802. A key press corresponds to coupling the circuit of FIG. 9b to the connection point where the key was pressed through the output signal port 821. The rectifying voltage divider consisting of the series coupling of a diode 902 and a resistor 903 between the output signal port 821 and the ground potential provides a partly rectified voltage waveform at the point between the diode 902 and the resistor 903. This voltage waveform is coupled to a peak detecting A/D converter 904 which samples the voltage waveform and gives a digital output word that corresponds to the detected peak value.

The resistance between the input signal port 801 and the output signal port 821 is uniquely defined by the selection of the coupling point which was coupled to the output signal port 821, i.e. the key which was pressed. Therefore the output of the peak detecting A/D converter 904 uniquely indicates, which key was pressed.

The resistive characteristics of all conducting materials are functions of environmental conditions, mainly temperature. Additionally the resistive characteristics of certain materials may exhibit aging drifts. All phenomena of this kind result in uncertainties regarding the "uniquely" defined resistance values that relate to the connection points 807, 808, 809, 810 etc. along the resistive strip. There are some measures that can be taken to compensate for such uncertainty. FIG. 9c illustrates an alternative circuit which resembles closely the circuit of FIG. 9a with the exception that the AC voltage generator 901 is now coupled to the second input signal port 802 instead of the first input signal port 801, which is connected to the ground potential. This circuit together with that of FIG. 9b enables the measurement of the resistance between the second input port 802 and the output signal port 821.

Figure 10:
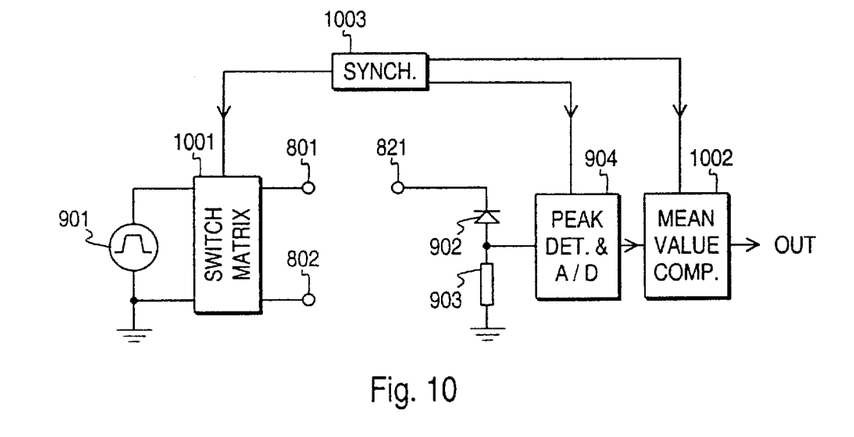
FIG. 10 is an overall circuit diagram of an arrangement according to an embodiment of the invention.
Figure 11:
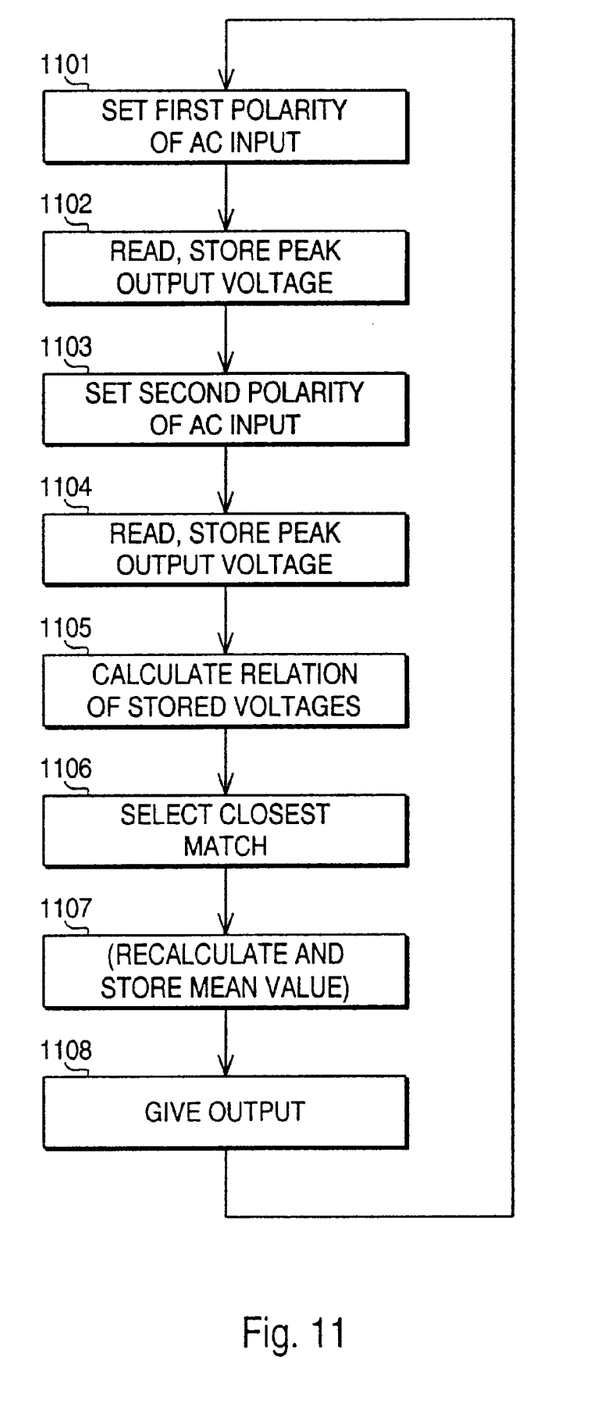
FIG. 11 illustrates the operation of the circuit of FIG. 10.

The functionality of alternating measurements of the resistances on both sides of a connection point is summarized in FIGS. 10 and 11. FIG. 10 illustrates an arrangement where an AC voltage source 901 is coupled to the input signal ports 801 and 802 through a switching matrix 1001 which is arranged to change the polarity of the coupling in response to a control command. The output signal port 821 is coupled—through a partly rectifying voltage divider 902, 903—to the input of a peak detecting A/C converter 904 which is further coupled to a mean value storage and comparation unit 1002. The control commands that synchronize the operation of the switching matrix 1001, the peak detecting A/C converter 904 and the mean value storage and comparation unit 1002 come from a control unit 1003.

At a certain first time instant 1101 a first polarity is selected for the coupling between the AC voltage source 901 and the input signal ports 801 and 802. The peak output voltage is measured and its value is stored at step 1102.

Immediately thereafter at step 1103 the polarity of the coupling between the AC voltage source 901 and the input signal ports 801 and 802 is reversed, and the peak output voltage is again measured and its value is stored at step 1104. The relation of the stored voltage values is unique to the connection point, i.e. the key which was pressed. It is calculated at step 1105 and compared against a look-up table of stored relation values at step 1106. When the closest match is found, the corresponding key identifier is output at step 1108. In order to keep the look-up table dynamically up to date, there may be a step 1107 where the value in the table which provided the closest match is replaced with a calculational result (typically a mean value) obtained from the original value in the look-up table and the newly measured relation value.

The above-described process is basically continuously running. It can, however, be amended to include a null return step where a zero value measured at step 1102 causes an immediate return to step 1101, so that the rest of the method is only executed when there is a detected key press.

In the foregoing we have not given any limitations regarding the form of the AC voltage signal which is fed into the resistive strip. Indeed the invention does not place much limitations in this respect. One advantageous way of generating the AC voltage signal is to select, from one of the system clock signals of which there are many to choose from in a radio device, a regular cyclic voltage pulse signal and to couple every Nth pulse therefrom to the resistive strip. The positive integer N is selected so that during a typical key press occurring at a randomly selected time instant there will be at least one voltage pulse coupled to the resistive strip. Statistical information about typical key presses is within the knowledge of a person skilled in the art, and an advantageous value for N is easily selected through simulation and experimenting. Pulses selected from a 13 MHz clock signal have been found to work well with input and output coupling capacitors of 10 pF. Such coupling capacitors correspond e.g. to electrode pad sizes of 56 mm$^2$ with an insulating film of 50 $\mu$m therebetween.

Figure 12:
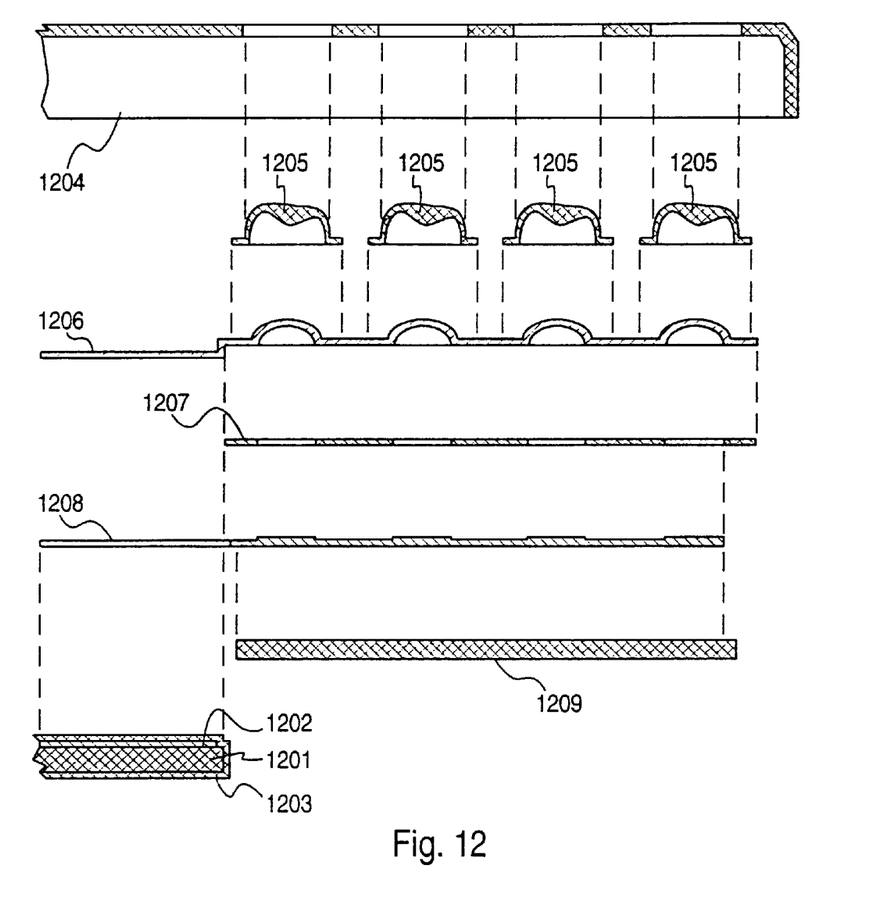
FIG. 12 illustrates another structure according to an embodiment of the invention.
Figure 13:
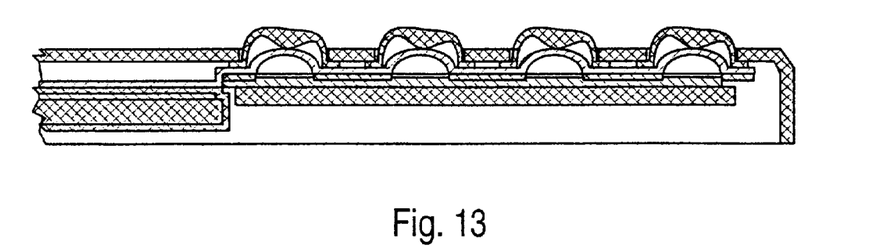
FIG. 13 illustrates the structure of FIG. 12 in an assembled configuration.

FIG. 12 is an exploded section through a structural arrangement where a PCB 1201 comprises on one surface thereof certain conductive pads 1202. The whole PCB is covered with an insulating protective layer 1203. There is an outer cover part 1204, and a keypad which is structurally associated with the outer cover part. The keypad consists of a number of visible keydomes 1205, a conductive dome sheet 1206, an insulating layer 1207, a meandering resistive strip 1208 and a lightguide 1209 stacked on top of each other. The stack is attached to the outer cover part 1204 e.g. by glueing, by ultrasonic welding or by using assembling taps in the outer cover part that extend through holes in the other parts and that are clenched to keep the arrangement together. The function and composition of the lightguide 1209 is known as such; it is used to conduct light from a light source (not shown) to the area under the keypad so that backlighting to the keys is provided. FIG. 13 shows the same structure in an assembled configuration. Both the resistive strip 1208 and the conductive dome sheet 1206 have extending parts that in the assembled configuration are next to their corresponding conductive pads 1202 on the PCB in order to implement the capacitive coupling.

The detection of key presses is based on an impedance measurement, which means that all impedances between the circuitry on the PCB and the resistive strip itself should be as accurately constant as possible. In order to decrease the possibility of arbitrary variation in the capacitance values of the coupling capacitors it is advantageous to make either the conductive pads 1202 on the PCB or the extending parts of the resistive strip 1208 and the dome sheet 1206 slightly larger than their counterparts. This way a slight misalignment during assembly does not have any remarkable effects on the coupling capacitances. It is probably most advantageous to make the extending parts of the resistive strip 1208 and the dome sheet 1206 slightly larger than the conductive pads 1202 on the PCB, since surface area on the PCB is scarce whereas the inner surface of the structural entity built around the outer cover part has usually lots of free space.

One group of advantageous materials which can be used to construct the resistive strip are the ICPs or intrinsically conductive polymers. These are plastic materials the conductivity of which can be quite accurately determined by modifying the material composition. It is even possible to affect the spatial conductivity distribution within a piece of material made of an ICP so that the piece may have a strip-like resistive element with the associated coupling points embedded in a practically nonconducting base material. The invention does not limit the selection of the material from which the resistive strip or other parts of the structure are manufactured, as long as their conductivities obey the definitions of conductivity, isolation and resistivity given earlier.

Figure 14:
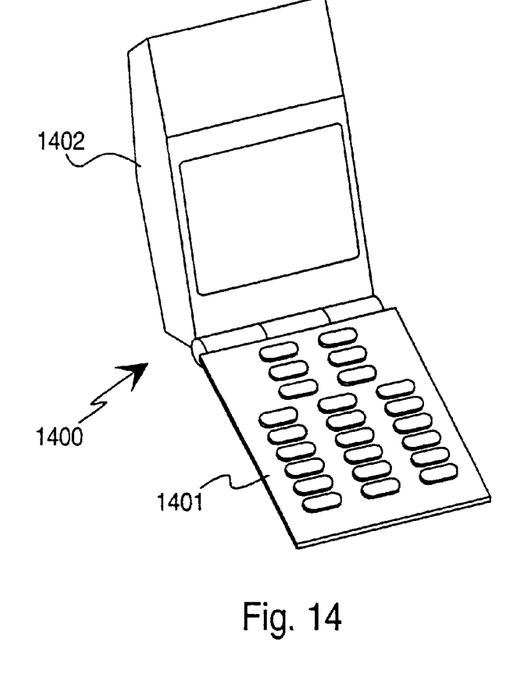
FIG. 14 illustrates the applicability of the invention to a mobile telecommunication device.
Figure 15:
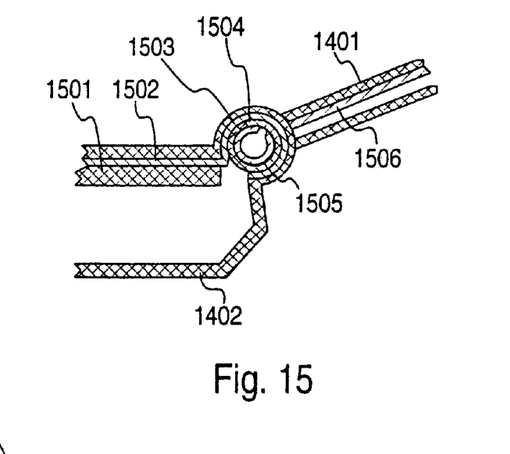
FIG. 15 is a partial section through a detail of the device in FIG. 14.

The invention does not require that the PCB and the keypad should be parallel or otherwise coincide with each other in location. FIG. 14 illustrates schematically a mobile telecommunication apparatus 1400 where a keypad is located on a hinged flip cover 1401 which is movable in relation to the body part 1402 of the device. FIG. 15 is a partial section through the hinge area where a capacitive connection between a PCB 1501 and the flip cover 1401 is realized. A conductor 1502 on the surface of the PCB is coupled to a first conductive cylindrical surface 1503 within the hinge, and an insulating bushing 1504 separates said first conductive cylindrical surface from a second, concentric conductive cylindrical surface 1505 within the hinge. The second conductive cylindrical surface 1505 is coupled to a connector 1506 leading to the inner parts of the flip cover 1401. All required capacitive couplings can be implemented within the hinge area. The insulating bushing 1504 also acts as a friction-reducing bearing, which increases the mechanical and electric reliability of the joint in comparison to known hinged joints where two conductive surfaces must have a galvanic contact therebetween.

Figure 16:
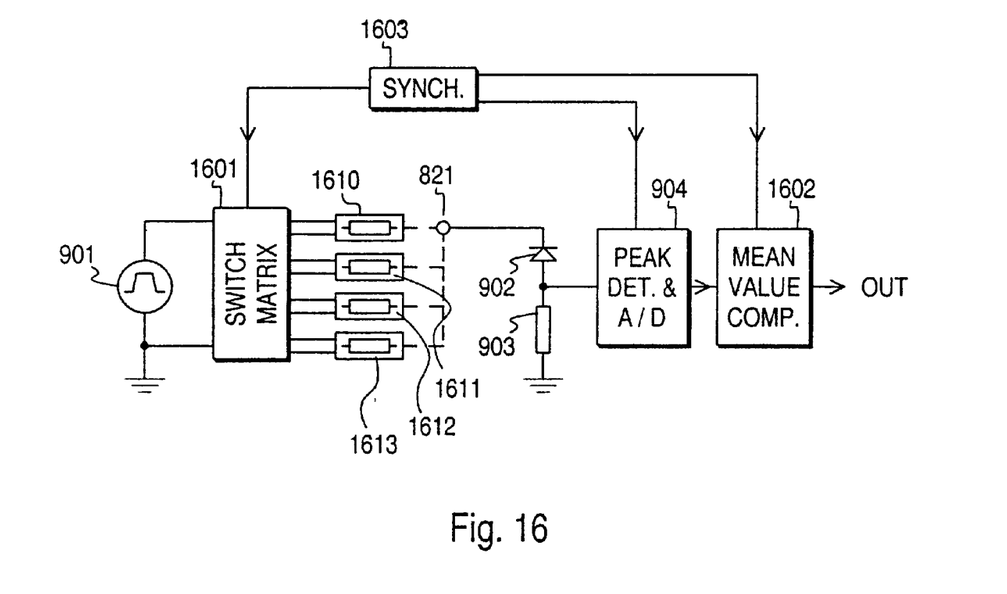
FIG. 16 is an equivalent circuit diagram of another arrangement according to an embodiment of the invention.

If the resistive strip becomes very long and the number of keys along it becomes very large, the differences in resistance between adjacent keys become relatively small which increases the possibility of errors in detecting the correct key. The problem may be circumvented by placing more than one resistive strip under the keyboard so that only a part of the keys is located along each resistive strip. FIG. 16 illustrates an arrangement where an AC voltage generator 901 is coupled to a switching matrix 1601 which is capable of temporarily coupling the AC voltage generator 901 to any of parallel resistive strips 1610, 1611, 1612 or 1613 with both polarities. A common conductive domesheet acts as the means for providing couplings from various points of the resistive strips to an output signal port 821 which is again coupled—through a partially rectifying voltage divider 902, 903—to a peak detecting A/D converter 904 and further to a mean value storage and comparator 1602.

Under the command of a control unit 1603 the switching matrix 1601 distributes voltage pulses to the resistive strips fast enough so that during a typical key press all resistive strips receive voltage signals with both polarities. The detection of resistance values and the conversion to digital key press indications follow the procedures described earlier in the case of a single resistive strip. Since the control unit 1603 controls both the switching matrix 1601 and the mean value storage and comparator 1602, it is not necessary to have truly unique voltage relations: two different resistive strips may well produce identical results. Careful synchronization in timing enables the detection circuitry to find out, from which resistive strip did the voltage measurement come.

Figure 17:
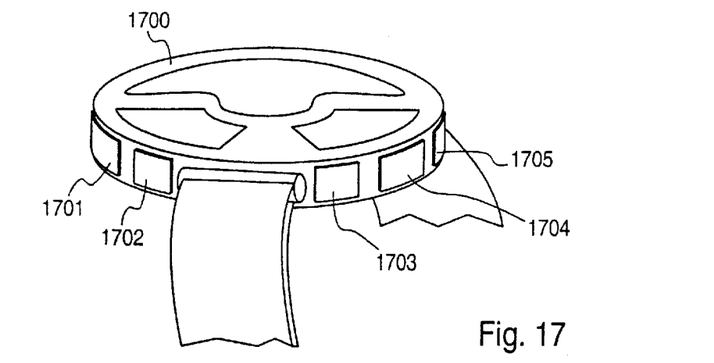
FIG. 17 illustrates the applicability of the invention to another mobile telecommunication device and FIG. 18 illustrates the applicability of the invention to exchangeable covers.

The invention does not require that the keypad is generally planar in form. Indeed the invention allows the keypad to follow any three-dimensional form. Especially if plastic materials and thin malleable metal sheets are used as structural components the keypad may take even very unusual forms. FIG. 17 illustrates schematically a wrist watch type mobile telecommunication device 1700 which has a cylindrical outer cover and a number of keys 1701, 1702, 1703, 1704 and 1705 along the cylindrical surface of the cover. The electronic functions of such a telecommunication device are typically built on an essentially circular PCB which is parallel to the essentially planar top and bottom surfaces of the casing, so it is impossible to implement a keypad of the type shown in FIG. 17 by applying the known technology of FIG. 1. According to the invention a cylindrical dome "sheet" extends along the inside of the cylindrical surface of the outer cover, and next to it there is a resistive strip arrangement that also circulate the inner surface of the cover. Both the dome "sheet" and the resistive strip are coupled to coupling tabs that lie next to corresponding pads on the PCB and implement thereby the capacitive coupling.

An additional advantage of the invention is that the conductive dome sheet functions in many cases as a part of the shielding against electromagnetic interference. The dome sheet is conductive, essentially continuous and located within the cover of the electronic device, so it is well suited for EMI shielding. This feature of the invention serves to reduce the overall component count of the electronic device, which also reduces manufacturing costs and structural complexity. If the conductive dome sheet is not used for such purpose, it is possible to replace the uniform, continues conductive sheet illustrated in the drawings with a "dome strip", a "dome mesh" or some other means that just conductively couples the domes at each key location to each other and to the point where the capacitive coupling to the PCB takes place.

The foregoing description has referred solely to the use of a resistive strip arrangement as the conversion element that converts an input voltage to various output voltage levels in a keypad arrangement. The use of a capacitive coupling does not as such require that the conversion element is a resistive strip. It is possible to modify the known principles shown in FIGS. 2 and 3 so that capacitive coupling to the conversion element is used. The drawback is then, however, usually the relatively large number of required parallel capacitive couplings. For example, if the connection matrix of FIG. 2 is placed within a structural entity built around a cover part and the input and output buffers 211 and 212 are located on a PCB, there must be as many as N+M=9 parallel capacitive couplings. Also in the arrangement of FIG. 3 the number of capacitive couplings tends to become larger than three.

Figure 18:
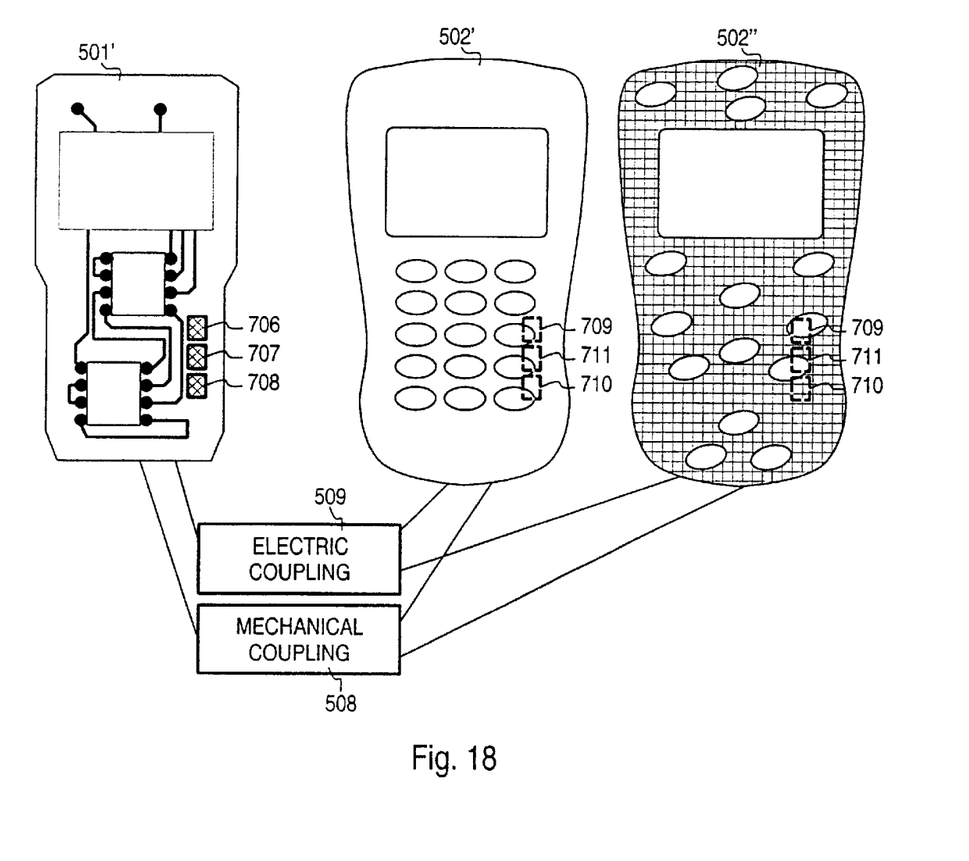

The invention is readily applicable to the case of exchangeable covers to mobile telephones and similar mobile telecommunication devices. FIG. 18 illustrates the applicability of the invention to the case of exchangeable covers. If the covers are to be exchanged by untrained users, the mechanical coupling 508 must be a very simple and reliable one; a readily applicable snap-on type mechanical coupling is known from the so-called Xpress-on covers where Xpress-on is a registered trademark of Nokia Mobile Phones. The capacitive coupling that consists of the conductive pads 706, 707 and 708 on a PCB 501' and corresponding capacitive electrodes 709, 710 and 711 in the exchangeable covers 502' and 502" is not sensitive to small misalignment, wear or dirtiness of the parts, which makes it very reliable. The invention enables the locations of the keys within an exchangeable cover to be selected freely: the new cover 502" does not need to have the keys in same locations as the old one 502' as long as the resistance values related to the keys remain essentially the same. Even the latter restriction may be lifted if the user is instructed to follow a certain running-in procedure after changing the cover where the user "teaches" the resistance values related to the new keys to the device by pressing through all keys in a certain order known to the device. This way the device gets, during a certain "learning mode", the first stored values to the mean value storage and comparison unit which was described earlier.

The invention makes it relatively easy to manufacture a watertight or hermetically sealed electronic device where a keypad still has a pleasant tactile feeling (many known hermetically sealed devices have a continuous plastic foil covering the whole keyboard which impairs the tactile feeling). It is possible to seal the resistive strip, the conductive dome sheet and the insulating layer therebetween into a single hermetically sealed structural unit where the dome sheet acts as the top surface and e.g. a plastic foil covers all other surfaces, including the capacitive electrodes. Keydomes with integral actuators (like those shown in FIG. 12) are placed on top of the domes in the dome sheet, and the whole structure is attached to an outer cover part. The PCB forms another hermetically sealed unit where a plastic foil or some other continuous insulating layer covers all surfaces including the coupling pads that act as parts of the capacitive coupling. The sealing layers do not block signals from passing capacitively between the PCB and the keypad.

A further possible generalization to the applicability of the invention relates to the nature of the coupling which we have exclusively described in the foregoing as the capacitive coupling. Some other forms of electromagnetic coupling share some of the advantages of capacitive coupling. In some cases it is possible to use inductive coupling where each coupling capacitor which appeared in the previous description is replaced with an inductive pair. An inductive coupling is based on driving a changing current through a first inductor so that the current induces a changing magnetic field. A second inductor which is close to the first one reacts to the changing magnetic field according to the known Maxwell equations so that a current starts flowing in the second inductor. In comparison with their capacitive counterparts inductive couplings have the disadvantage of requiring relatively large currents, which tends to make them disadvantageous in applications where electric power should be used very thriftily and efficiently. Another known form of electromagnetic coupling is optoelectronic coupling where electromagnetic radiation on the wavelengths of visible or nearly visible light serves as the signal transferring means. An optoelectronic coupler consists of a light emitting transmitter diode and a photosensitive semiconductor receiver. The drawbacks of optoelectronic coupling involve aging of the components, requirement for alignment and clean optical transmitter and receiver surfaces as well as the relatively low amount of energy which is transmitted.

The above-given exemplary embodiments of the invention should not be construed to pose limitations to the applicability of the appended claims. Especially the various alternative embodiments of the invention may be combined to each other in many ways.

What is claimed is:

1. A keypad arrangement for an electronic device, comprising:
   a keypad comprising activatable keys,
   input signal means for bringing an electric input signal to the keypad,
   signal conversion means for responding to a key activation by selectively converting the input signal into an electric output signal the value of which depends on the activated key,
   output signal detection means for detecting the value of the electric output signal,
   a first capacitive coupling between the input signal means and the signal conversion means, and
   a second capacitive coupling between the signal conversion means and the output signal detection means.

2. A keypad arrangement according to claim 1, wherein the signal conversion means comprise:
   a resistive strip having a first end and a second end, which first end and second end are coupled to said first capacitive coupling, and comprising a multitude of coupling points at different positions between said first end and said second end, and
   means for selectively coupling, as a response to a key action, one of said coupling points at a time to said second capacitive coupling.

3. A keypad arrangement according to claim 2, wherein each of said first end and second end constitutes a capacitive electrode in said first capacitive coupling.

4. A keypad arrangement according to claim 2, wherein said means for selectively coupling one of said coupling points at a time to said second capacitive coupling comprises a continuous conductive element that is located adjacent to said resistive strip and comprises a resilient conductive dome at the location of each coupling point in the resistive strip.

5. A keypad arrangement according to claim 4, wherein said continuous conductive element comprises an extending portion which constitutes a capacitive electrode in said second capacitive coupling.

6. A keypad arrangement according to claim 4, comprising a number of keydomes for providing a tactile surface for each conductive dome in said continuous conductive element.

7. An exchangeable cover for a mobile telecommunication device, comprising:
   a keypad that comprises activatable keys,
   first capacitive coupling means for capacitively obtaining an electric input signal to the keypad from an external input signal source,
   second capacitive coupling means for capacitively providing an output signal from the keypad to an external signal detector, and
   between said first capacitive coupling means and said second capacitive coupling means signal conversion means for responding to a key activation by selectively converting an electric input signal into an electric output signal the value of which depends on the activated key.

8. An exchangeable cover according to claim 7, comprising a first set of capacitive electrodes as said first capacitive coupling means and a second set of capacitive electrodes as said second capacitive coupling means, wherein the number of capacitive electrodes in each set is at least one.

9. An exchangeable cover according to claim 8, comprising:
   a cover body with a number of holes therethrough, each hole defining a key location,
   a resistive strip having a first end and a second end, which first end and second end are coupled to said first set of capacitive electrodes, and comprising a multitude of coupling points at certain positions between said first end and said second end that correspond to the locations of said holes in said cover body,
   a continuous conductive element that is located between said resistive strip and said cover body and comprises a resilient conductive dome at the location of each coupling point in the resistive strip, and
   a number of keydomes protruding through said holes for providing a tactile surface for each conductive dome in said continuous conductive element.

10. An exchangeable cover according to claim 7, comprising mechanical coupling means for providing a repeatedly disconnectable snap-on coupling between it and the mobile telecommunication device.

11. A set of exchangeable covers for a mobile telecommunication device, comprising:
   a first cover and a second cover,
   within each of said first and second covers means for mechanically attaching the cover to the same mobile telecommunication device,
   within each of said first and second covers a keypad that comprises activatable keys,
   within each of said first and second covers first capacitive coupling means for capacitively obtaining an electric input signal to the keypad from an external input signal source,
   within each of said first and second covers second capacitive coupling means for capacitively providing an output signal from the keypad to an external signal detector,
   within each of said first and second covers signal conversion means for responding to a key activation by selectively converting an electric input signal into an electric output signal the value of which depends on the activated key; and
   wherein the first cover has the keys of the keypad at different locations than the second cover.

12. An electronic device, comprising:
   a keypad that comprises activatable keys,
   an outer cover part,
   a printed circuit board,
   input signal generating means for generating an input signal to the keypad,
   signal conversion means for responding to a key activation by selectively converting the input signal into an output signal the value of which depends on the activated key, and
   output signal detection means for detecting the value of the output signal;
   wherein:
   the input signal generating means and the output signal detection means are located within the printed circuit board,
   the signal conversion means are attached to the outer cover part, and the electronic device comprises a first capacitive coupling between the input signal generating means and the signal conversion means, and a second capacitive coupling between the signal conversion means and the output signal detection means.

13. An electronic device according to claim 12, comprising:

within the printed circuit board an AC voltage generator for generating an AC voltage signal as an input signal to the keypad, within the printed circuit board a first set of capacitive electrodes as a part of said first capacitive coupling means, said first set of capacitive electrodes being coupled to said AC voltage generator, within the signal conversion means a second set of capacitive electrodes as a part of said first capacitive coupling means, within the signal conversion means and coupled to said second set of capacitive electrodes a resistive strip having a first end and a second end comprising a multitude of coupling points at different positions between said first end and said second end, within the signal conversion means a third set of capacitive electrodes as a part of said second capacitive coupling means, within the signal conversion means and coupled to said third set of capacitive electrodes means for selectively coupling, as a response to a key activation, one of said coupling points at a time to said third set of capacitive electrodes, within the printed circuit board a fourth set of capacitive electrodes as a part of said second capacitive coupling means, within the printed circuit board and coupled to said fourth set of capacitive electrodes a peak detector for detecting an extreme value of an output AC voltage signal; and wherein the number of capacitive electrodes in each set of capacitive electrodes is at least one.

14. An electronic device according to claim 13, further comprising, between said AC voltage generator and said first set of capacitive electrodes, switching means for selectively coupling the AC voltage signal generated by said AC voltage generator to said first set of capacitive electrodes with different polarities.

15. An electronic device according to claim 14, further comprising, coupled to said peak detector, means for selectively storing at least two detected extreme values in synchronism with the operation of said switching means so that said two detected extreme values correspond to different polarities of the AC voltage signal generated by said AC voltage generator.

16. An electronic device according to claim 12, wherein the output signal detection means comprise a mean value storage and comparator for storing detected values associated with previous key activations and for comparing a detected output signal value against the stored values.

* * * * *